United States Patent [19]
Yen et al.

[11] Patent Number: 5,705,442
[45] Date of Patent: Jan. 6, 1998

[54] OPTIMIZED TUNGSTEN CONTACT PLUG PROCESS VIA USE OF FURNACE ANNEALED BARRIER LAYERS

[75] Inventors: Haw Yen; Shaw-Tzeng Hsia, both of Hsin chu, Taiwan

[73] Assignee: Vanguard International Semiconductor Corporation, Hsin-Chu, Taiwan

[21] Appl. No.: 549,331

[22] Filed: Oct. 27, 1995

[51] Int. Cl.[6] .................................................. H01L 21/44
[52] U.S. Cl. ........................... 438/653; 438/672; 438/677
[58] Field of Search ................................ 437/186, 195; 438/652, 653, 657, 672, 674, 677

[56] References Cited

U.S. PATENT DOCUMENTS

| | | | |
|---|---|---|---|
| 5,236,852 | 8/1993 | Cherniawski et al. | 437/186 |
| 5,244,835 | 9/1993 | Hachiya | 437/186 |
| 5,286,675 | 2/1994 | Chen et al. | 437/195 |
| 5,492,863 | 2/1996 | Higgins, III | 437/186 |
| 5,587,338 | 12/1996 | Tseng | 437/186 |
| 5,599,736 | 2/1997 | Tseng | 437/186 |

OTHER PUBLICATIONS

Wolf et al., "Silcion Processing For The VLSI Era", vol. 1:, Process Technology, Lattice Press pp. 303–308, 1986.

*Primary Examiner*—John Niebling
*Assistant Examiner*—Michael S. Lebentritt
*Attorney, Agent, or Firm*—George O. Saile; Stephen B. Ackerman

[57] ABSTRACT

A process, to fill small diameter contact holes with tungsten, without deleterious attack of contact hole liner materials, during the tungsten deposition, has been developed. The process consists of using a titanium nitride barrier layer, overlying a titanium adhesive layer. However the barrier characteristics of titanium nitride are enhanced by subjecting this layer to an anneal cycle in an nitrogen ambient. The annealing produces a more robust barrier in terms of incorporating additional nitrogen into the deposited titanium nitride layer, as well as forming titanium nitride on any underlying titanium, that may be exposed due to defects in the deposited titanium nitride layer.

22 Claims, 4 Drawing Sheets

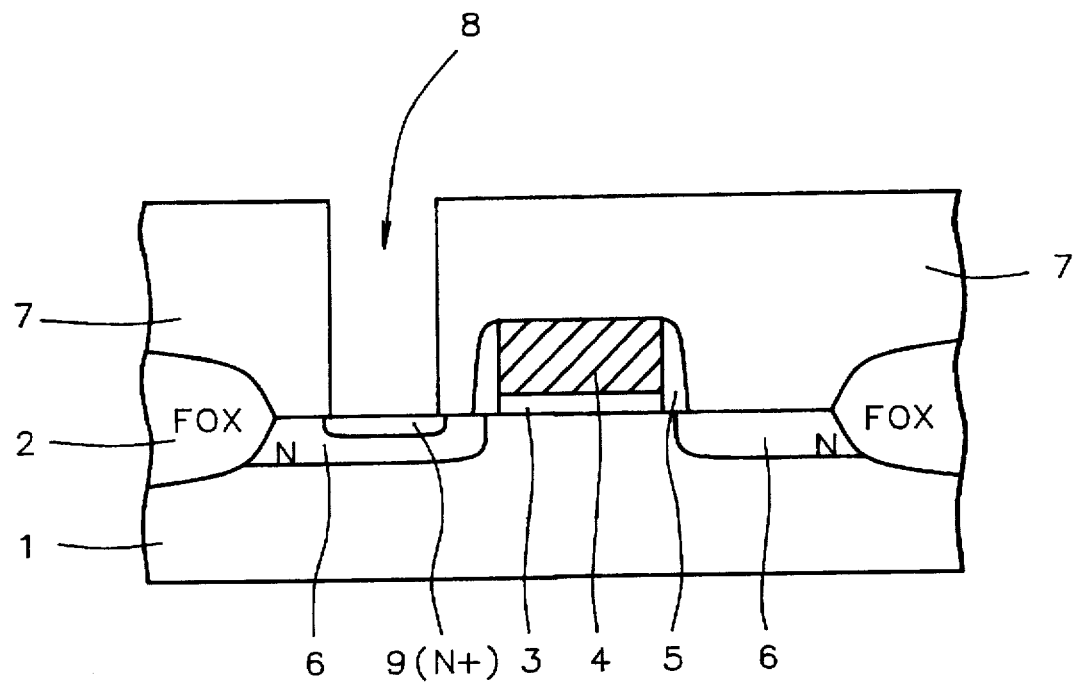
FIG. 1
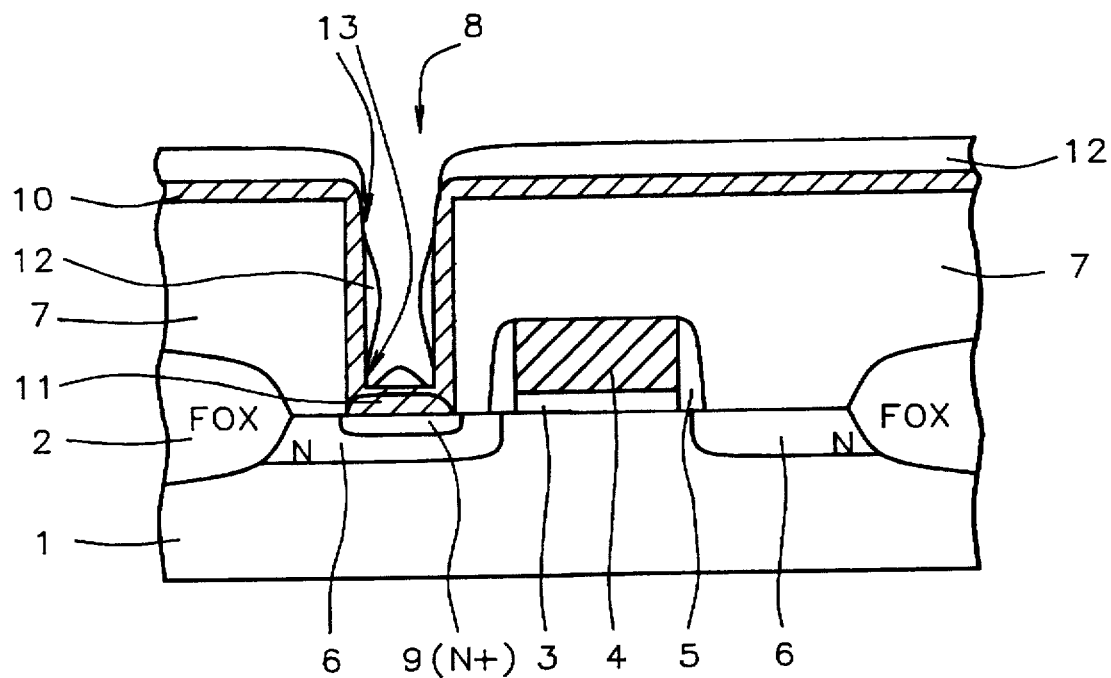
FIG. 2 – Prior Art

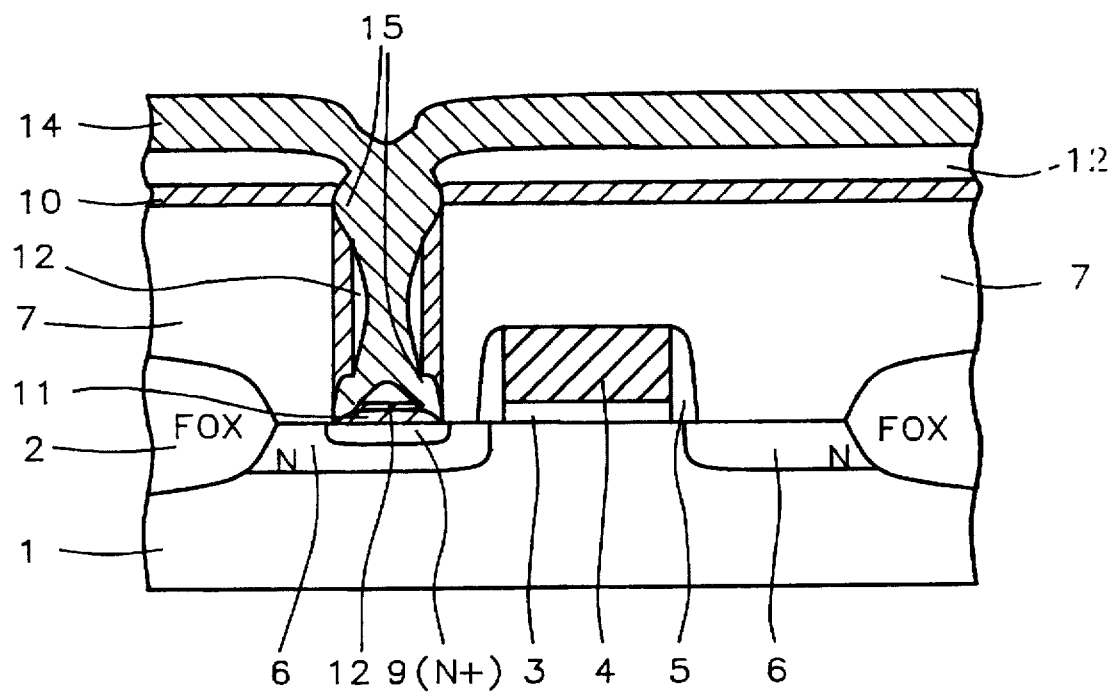
FIG. 3 - Prior Art
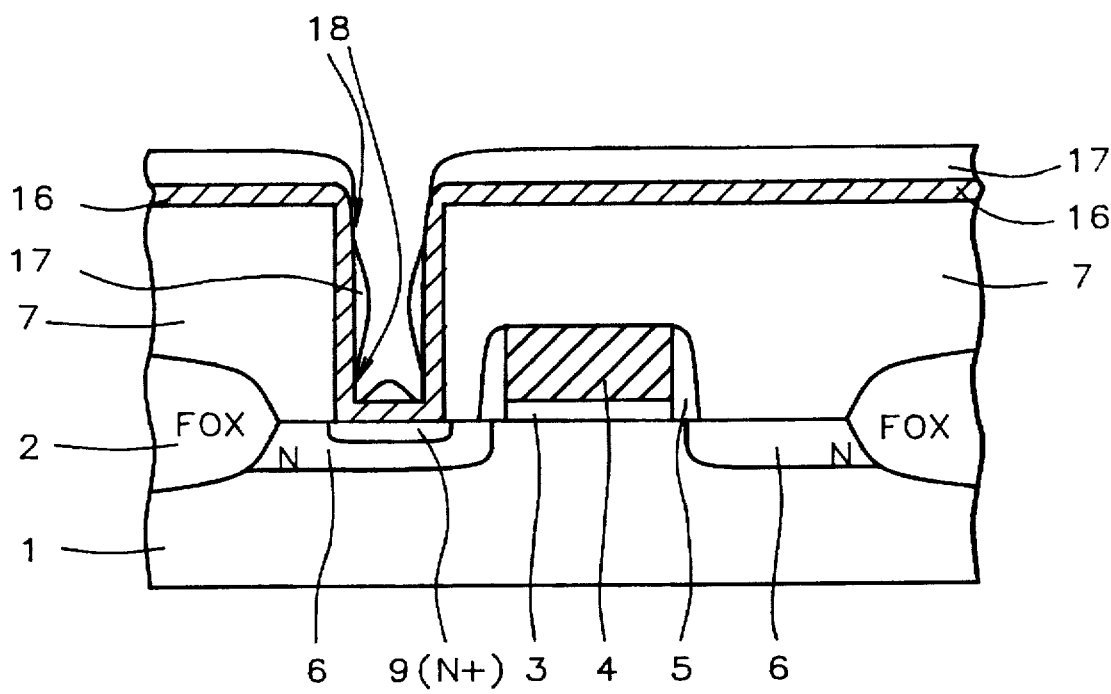
FIG. 4

OPTIMIZED TUNGSTEN CONTACT PLUG PROCESS VIA USE OF FURNACE ANNEALED BARRIER LAYERS

BACKGROUND OF THE INVENTION (1) Field of the Invention

The present invention relates to the fabrication methods used for semiconductor devices, and more specifically to an optimized process for creating reliable contact studs, used to connect the active device region to an overlying metallization.

(2) Description of Prior Art

The semiconductor industry is continually striving to produce silicon chips at lower costs, while still attempting to increase device performance. These objectives are being addressed by the semiconductor engineering community, in terms of micro-miniaturazation. As critical device shapes become smaller, performance increases due to decreasing resistances, as well as to decreasing capacitances. In addition micro-miniaturazation allows for more silicon chips to be placed on a specific size silicon wafer, thus reducing the cost of a chip. Many semiconductor fabrication disciplines have contributed to the micro-miniaturazation objective. Advances in photolithography, in terms of more sophisticated exposure cameras, as well as the development of more sensitive photoresist materials, have allowed sub-micron images to be routinely produced in photoresist films. Equally important has been the rapid development of the anisotropic dry etching discipline, allowing the sub-micron images in an overlying photoresist layer to be successfully transferred to an underlying semiconductor material. Other fabrication sectors, such as ion implantation and low pressure chemical vapor deposition, (LPCVD), have also been major contributors in satisfying the micro-miniaturazation objective.

Silicon devices, fabricated with decreasing critical dimensions, can sometimes generate new problems. For example small diameter contact holes, filled with conductive materials, and used to interconnect underlying silicon device regions to overlying metallizations, can result in reliability problems if the correct contact hole material is not chosen. For example if an aluminum based metallurgy were used to fill a contact hole, the current density generated in the aluminum filled contact hole may exceed the capabilities of aluminum, thus resulting in electromigration reliability problems. Therefore the use of tungsten, with its superior current carrying capability, has ben used for filling small diameter contact holes.

The use of tungsten as a contact fill material requires the use of an underlying contact layer, as well as an underlying barrier layer. The contact layer is needed to provide both good ohmic contact to the silicon device, and also serves as an adhesion layer between the tungsten fill and the sides of a silicon oxide contact hole. Titanium is usually used for this purpose, providing good ohmic contact, after centering converts titanium to titanium disilicide at the bottom of the contact hole. Titanium also provides excellent adhesion between a subsequent material and the silicon oxide contact hole. However if only a titanium contact, or adhesive layer, were used, the subsequent tungsten chemical vapor deposition process would severely damage the exposed titanium. The tungsten deposition is performed via the decomposition of tungsten hexafluoride, and in addition to the deposition of tungsten, a serious reaction with titanium occurs, eroding the critical contact and adhesive layer. One solution, to overcome the titanium erosion phenomena, has been to place a barrier layer of either sputtered tungsten or titanium nitride, on the titanium layer. Chen, et al, in U.S. Pat. No. 5,286,675, have described a process in which a titanium - titanium nitride composite is used in contact holes prior to filling with tungsten. However that invention dose not offer the robust barrier characteristics needed to reduce, or eliminate, the attack of titanium. For example the aspect ratio of small diameter contact holes is steadily increasing, making it extremely difficult to uniformly deposit a barrier layer on a titanium coated contact hole. Although titanium nitride will able to perform as an excellent barrier material and withstand the tungsten deposition, the problem arises in specific regions where poor titanium nitride coverage exists, allowing attack of titanium to occur. The lack of adequate titanium nitride coverage, leads to erosion of the underlying titanium adhesive layer during the subsequent tungsten deposition process, resulting in a lack of tungsten adhesion. This adhesion loss is sometimes referred to as tungsten peeling, or the volcano effect.

This invention will describe a process in which a titanium - titanium nitride composite layer is used with chemically vapor deposited tungsten filled contact holes. However this invention will describe a process for producing a more robust titanium nitride barrier layer, providing excellent protection against titanium attack, and adhesion loss that can result as a consequence of tungsten deposition.

SUMMARY OF THE INVENTION

It is an object of this invention to provide an optimized process for the fabrication of tungsten contact plugs, used to connect active silicon device regions, in a semiconductor substrate, to overlying metallizations.

It is another object of this invention to initially deposit a titanium film in a contact hole, prior to filling with tungsten, to serve as contact and adhesive layer.

It is still another object of this invention to deposit a barrier layer of titanium nitride, on the titanium layer, prior to filling the contact hole with tungsten.

It is still yet another object of this invention to treat the titanium nitride layer with nitrogen, at elevated temperatures, for purposes of increasing the barrier effectiveness of the titanium nitride layer, prior to filling the contact hole with tungsten.

In accordance with the present invention a process is described for fabricating tungsten filled contact holes, with optimized barrier layers, used to connect active silicon device regions to overlying metallizations. A contact hole is opened in a dielectric material, to an active device region in a semiconductor substrate. An ion implantation is performed to increase the impurity concentration at the bottom of the contact hole. A layer of titanium is than deposited, followed by the deposition of a titanium nitride layer. A furnace anneal, in an nitrogen ambient is next performed in order to incorporate additional nitrogen into the titanium nitride barrier layer, and also to form titanium nitride on exposed, underlying titanium, through any defect in the overlying titanium nitride layer. Chemical vapor deposition of tungsten is than performed to fill the contact hole, followed by a dry etching procedure used to remove tungsten from all areas except from the filled contact hole. Interconnect metallization and patterning complete the process.

BRIEF DESCRIPTION OF THE DRAWINGS

The object and other advantages of this invention are best described in the preferred embodiment with reference to the attached drawings that include:

FIG. 1, schematically showing a silicon device region, with an unfilled contact hole.

FIG. 2-3, which schematically, in cross-sectional representation, indicate prior art, in which unsuccessful tungsten filled contact holes were created.

FIG. 4-7, which schematically, in cross-sectional style, show the stages of fabrication used to produce tungsten filled contact holes, with enhanced barrier characteristics.

DESCRIPTION OF THE PREFERRED EMBODIMENTS

Figure 5:
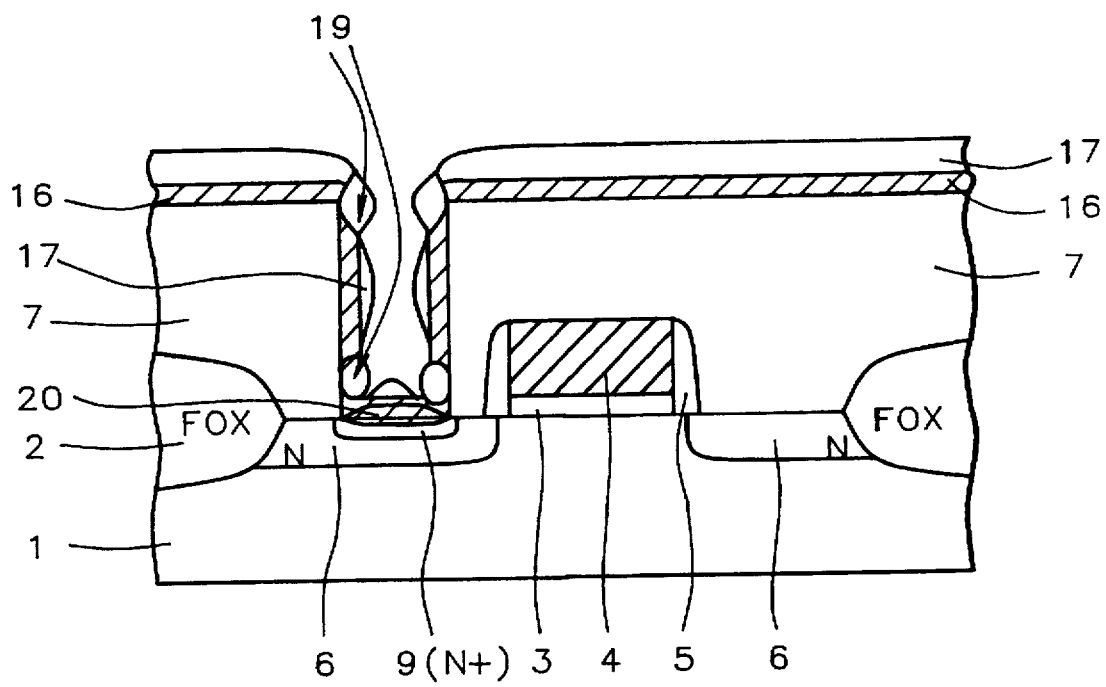

The method of forming tungsten filled contact holes, with enhanced titanium nitride barrier characteristics, will now be covered in detail. This enhanced barrier layer can be used as part of metal oxide semiconductor field effect transistors, (MOSFET), that are currently being manufactured in industry, therefore only the specific areas unique to understanding this invention will be covered in detail.

FIG. 1, shows a typical N type, (NFET), device that the tungsten filled contact hole, using the enhanced titanium nitride barrier process, can be applied to. A substrate, 1, composed of P type single crystalline silicon, with a <100> orientation, is used. Thick field oxide regions, (FOX), 2, are used for isolation purposes. The oxide regions are produced by patterning a silicon nitride - silicon dioxide, composite, using conventional photolithographic and reactive ion etching, (RIE), techniques, and than using the composite as an oxidation mask to produce a FOX region between about 4000 to 6000 Angstroms thick, via thermal oxidation processing. The masking dielectric composite is than removed using hot phosphoric acid for the silicon nitride layer, while a buffered hydrofluoric acid solution is used to remove the underlying, thin silicon dioxide layer, exposing the subsequent device region. A thin silicon dioxide, gate insulator, 3, is grown, at a temperature between about 800° to 950° C., to a thickness between about 70 to 300 Angstroms. A polysilicon layer is next deposited at a temperature between about 550° to 750° C., to a thickness between about 2000 to 4000 Angstroms using LPCVD processing. The polysilicon deposition can be performed using insitu doping techniques, via use of phosphine and silane, or an intrinsic deposition can be performed using only silane. For the case of the intrinsic polysilicon an ion implantation of phosphorous is performed at an energy between about 50 to 100 Kev., at a dose between about 1E15 to 1E16 atoms/cm². Standard photolithographic and RIE procedures, using a chlorine etching chemistry, are than performed to establish the polysilicon gate structure, 4, shown in FIG. 1.

A silicon oxide layer is than deposited using either LPCVD or plasma enhanced chemical vapor deposition, (PECVD), processing, using tetraethylorthosilicate as a source, at a temperature between about 500° to 700° C., to a thickness between about 2000 to 4000 Angstroms. A selective, anisotropic RIE step, using $CHF_3$, is performed to create silicon oxide sidewall spacer, 5. Heavily doped, N type, source and drain regions, 6, are formed using arsenic ion implantation, at an energy between about 50 to 150 Kev., at a dose between about 1E14 to 5E15 atoms/cm². Another layer of silicon oxide, 7, is deposited, again using either LPCVD or PECVD processing, at a temperature between about 500° to 750° C., to a thickness between about 8000 to 15000 Angstroms. Photolithographic and RIE processing, using $CHF_3$, are used to open contact hole, 8. Another ion implantation, using phosphorous, at an energy between about 50 to 80 Kev., at a dose between about 1E15 to 5E15 atoms/cm² is used to enhance the ohmic properties of the subsequent contact.

FIGS. 2-3, show prior art, and attempts at filling the contact hole with LPCVD tungsten. First a layer of titanium, 10, is r.f. sputtered, for purposes of lowering contact resistance, as well providing an adhesive layer between silicon oxide, 7, and subsequent overlying metallizations. In addition the titanium, when subjected to elevated temperatures, will convert to a titanium disilicide layer, 11, at areas where the titanium resided on bare silicon. This is shown schematically in FIG. 2. The barrier layer of titanium nitride, 12, is next deposited, again using r.f. sputtering processes. It can be seen that the ability to uniformly coat the exposed titanium layer, 10, with the barrier material, titanium nitride, 12, is difficult. The difficulty increases as the aspect ratio of contact hole, 8, increases, and thus for more aggressive designs, calling for deeper, yet smaller diameter contact holes, the conventional titanium nitride deposition process is limited. FIG. 2, schematically indicates specific areas, 13, in which an insufficient barrier layer, 12, was deposited, resulting in exposure of titanium in those bare areas. FIG. 3, schematically shows the result of a tungsten deposition on the unprotected titanium layer. The tungsten layer, 14, is obtained via decomposition of tungsten hexafluoride. The reaction products, in the form of free fluorine, etch the exposed titanium in areas, 13, where a lack of adequate titanium nitride barrier existed, producing attacked regions, 15. These areas, 15, now interfaced with tungsten, 14, can result in a lack of tungsten adhesion, or peeling of tungsten from the contact hole. Another phenomena arising from the attack of titanium, is a volcano, or an aggravated removal, or undercut of titanium, even in areas where titanium nitride protection existed. This peeling phenomena, initiating as a result of poor titanium nitride coverage, is more pronounced at the edges of wafers, and thus a serious yield problem can arise due to this series of processing steps.

The process designed to reduce or eliminate the peeling phenomena will now be described. FIG. 4, shows a titanium layer, 16, deposited via r.f. sputtering, to a thickness between about 250 to 350 Angstroms. A native oxide clean was performed prior to the titanium deposition, via a dilute hydrofluoric acid procedure, using 200 parts water, to one part acid, for a period of about 90 seconds. Next a deposition of titanium nitride, 17, is performed, using either r.f. sputtering using a titanium nitride target, or via reactive r.f. sputtering. The thickness of the titanium nitride layer is between about 600 to 1000 Angstroms. FIG. 4, again as was the case for the prior art, indicates regions where lack of coverage of the barrier titanium nitride layer, 17, resulted in exposed titanium areas, 18.

The exposed regions, 18, are now treated with a nitrogen anneal that will not only increase the integrity of the titanium nitride layer, 17, by stuffing the layer with additional nitrogen, but will also result in the formation of titanium nitride, 19, in regions where exposed titanium existed. This is shown schematically in FIG. 5. The conditions used for the nitrogen anneal are critical, specifically attempting to avoid deleterious oxide formation on the exposed titanium at the beginning of the anneal cycle. Therefore the cycle initiates with a wafer load occurring at a temperature between about 275° to 325° C., at a nitrogen flow between about 25 to 30 liters/min. Next a temperature stabilizing and ramp up step, at a temperature between about 550° to 650° C., for a time between about 100 to 120 minutes, in an nitrogen flow between about 25 to 30 liters/min, is performed, followed by the nitrogen anneal cycle, again at a temperature between about 550° to 650° C., for a time between about 45 to 75 minutes, in a nitrogen flow between about 25 to 30 liters/min. A temperature ramp down and wafer unload, at a temperature between about 275° to 325° C., in a nitrogen flow, again between about 25 to 30 liters/min., complete the anneal cycle. The amount of titanium nitride, 19, formed from exposed titanium regions, 18, is between about 100 to 200 Angstroms, in thickness. The nitrogen anneal cycle also resulted in the formation of titanium disilicide, 20, at the bottom of contact hole, 8.

Figure 6:
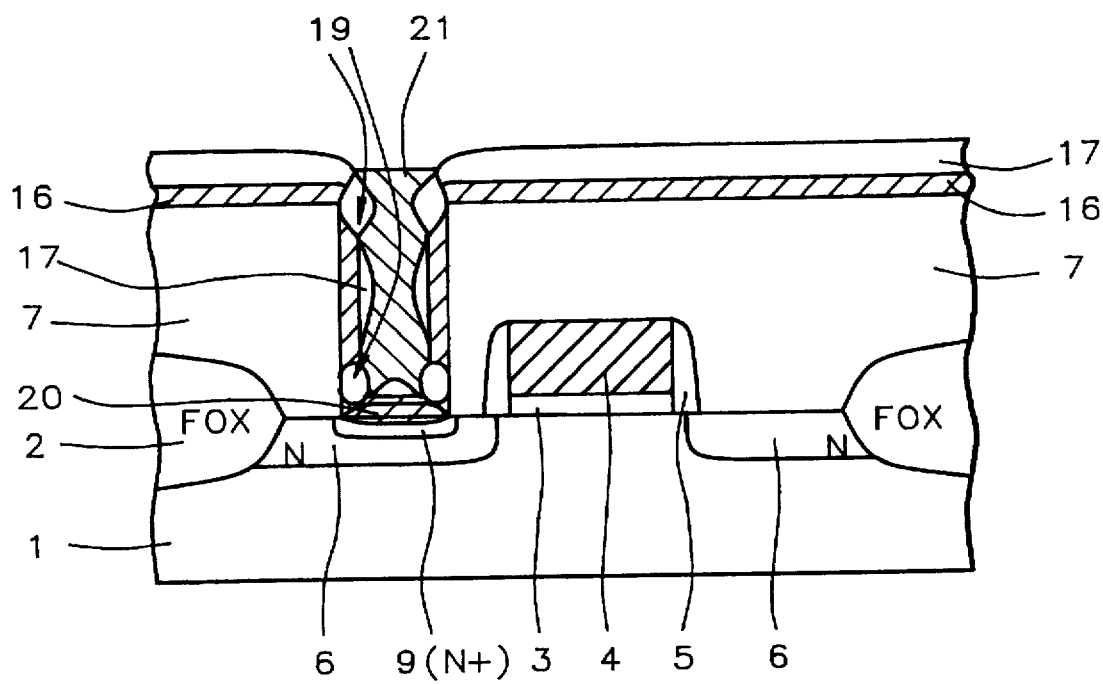
Figure 7:
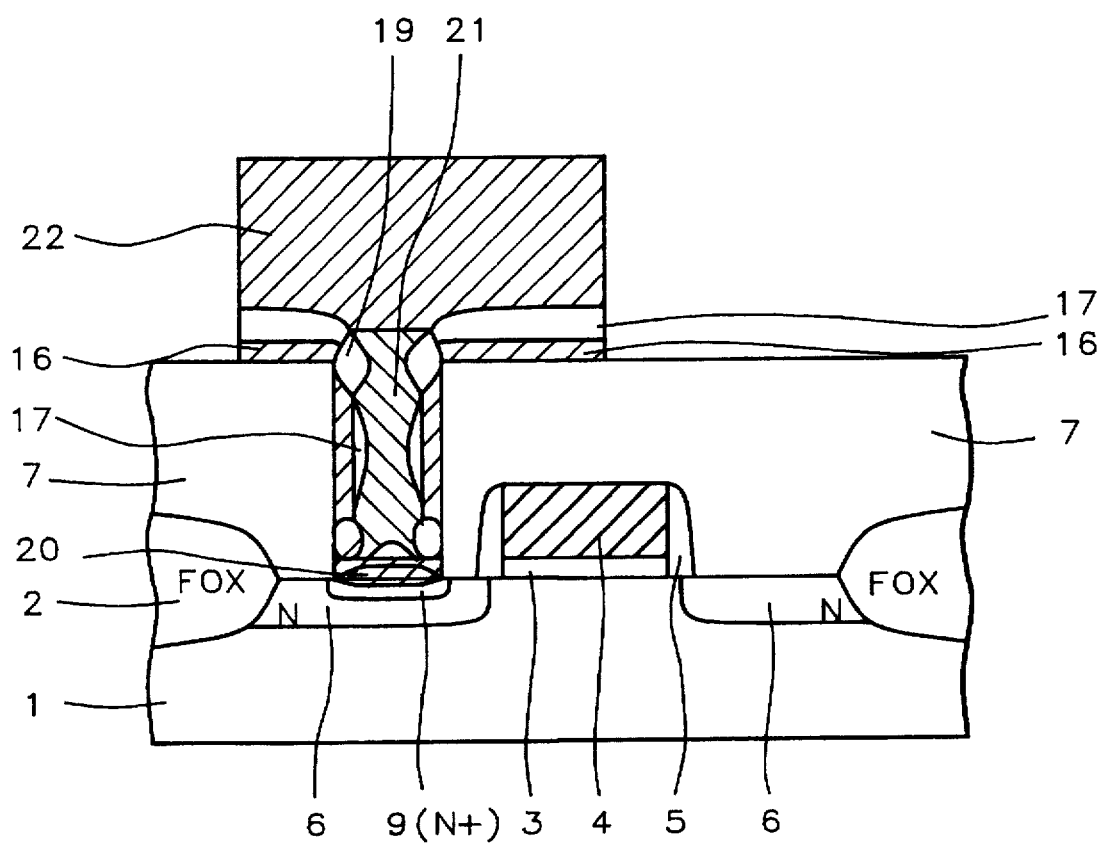

The deposition of tungsten, 21, via LPCVD processing, at a temperature between about 450° to 475° C., to a thickness between about 6000 to 8000 Angstroms, using tungsten hexafluoride, is shown in FIG. 6. It can be seen that the tungsten now entirely interfaces underlying titanium nitride, and thus the free fluorine ions, generated during the tungsten hexafluoride decomposition process, is unable to attack titanium, thus avoiding the deleterious peeling or volcano phenomena. Also shown in FIG. 6, is the etchback of tungsten, 21, via selective RIE processes, using a $SF_6$—argon etch chemistry. FIG. 7, shows the fabrication of the interconnect metallization structure, 22. This is accomplished via r.f. sputter deposition of an aluminum based metallurgy, using between about 0 to 1% copper, and between about 0 to 1% silicon. Conventional photolithographic and RIE patterning, using a chlorine etch chemistry, is used to produce the interconnect metal structure.

This process for enhanced titanium nitride barriers, for tungsten filled contact holes, although shown as part of an NFET device, can also be applied to P type, (PFET), devices, as well as to complimentary, (CMOS), and BiCMOS devices.

While this invention has been particularly shown and described with reference to, the preferred embodiments thereof, it will be understood by those skilled in the art that various changes inform and details may be made without departing from the spirit and scope of this invention.

What is claimed is:

1. A method for fabricating a MOSFET device, on a semiconductor substrate, using a contact hole, lined with adhesive and barrier layers, and filled with a metal, to provide electrical contact between an active device region in said semiconductor substrate, and an overlying interconnect metallization, comprising the steps of:

providing device elements on said semiconductor substrate;

deposition of a dielectric layer on said semiconductor substrate, including deposition on said device elements;

photolithographic processing to open a region in photoresist, exposing said dielectric layer, directly over a specific region of said device element;

anisotropic etching of said dielectric layer, in opened region of said photoresist, to create a contact hole to said specific region in said device element;

ion implanting a first conductivity imparting dopant into said specific region of said device element, to create said active device region;

surface cleaning of said active device region;

deposition of an adhesive layer on said dielectric layer, on sides of said contact hole, and on surface of said active device region;

deposition of a barrier layer on said adhesive layer;

annealing in an nitrogen ambient, at a temperature between about 550° to 650° C., for a time between about 45 to 75 min;

depositing metal, on said barrier layer, completely filling said contact hole;

etch back of said metal to form a metal plug in said contact hole;

deposition of an interconnect metallization layer; and patterning of said interconnect metallization layer to form metal interconnect structure.

2. The method of claim 1, wherein said device element in said semiconductor substrate, is an N type, field effect transistor.

3. The method of claim 1, wherein said dielectric layer is silicon oxide, deposited using LPCVD or PECVD processing, at a temperature between about 500° to 750° C., to a thickness between about 8000 to 15000 Angstroms.

4. The method of claim 1, wherein said contact hole is formed via anisotropic reactive ion etching, using $CHF_3$.

5. The method of claim 1, wherein said first conductivity imparting dopant is phosphorous, ion implanted at an energy between about 50 to 80 KEV., at a dose between about 1E15 to 5E15 atoms/$cm^2$.

6. The method of claim 1, wherein surface cleaning of said active device region is performed using a solution of about 200 parts water, to one part hydrofluoric acid, at a temperature between about 20° to 25° C., for a time between about 75 to 105 seconds.

7. The method of claim 1, wherein said adhesive layer is titanium, deposited using r.f. sputtering, to a thickness between about 250 to 350 Angstroms.

8. The method of claim 1, wherein said barrier layer is titanium nitride, deposited via direct r.f. sputtering, to a thickness between about 600 to 1000 Angstroms.

9. The method of claim 1, wherein said barrier layer is titanium nitride, deposited via reactive r.f. sputtering, using a nitrogen containing ambient, to a thickness between about 600 to 1000 Angstroms.

10. The method of claim 1, wherein annealing of said barrier layer is performed by; loading of samples in furnace at a temperature between about 275° to 325° C., in a nitrogen flow of between about 25 to 30 liters/min., ramp up and stabilization at a temperature between about 550° to 650° C., for a time between about 100 to 120 min., in an nitrogen flow between about 25 to 30 liters/min., annealing at a temperature between about 550° to 650° C., in an nitrogen flow between about 25 to 30 liters/min., for a time between about 45 to 75 min., and ramp down and unload at a temperature between about 275° to 325° C., in a nitrogen flow between about 25 to 30 liters/min.

11. The method of claim 1, wherein annealing of said barrier layer results in the formation of a titanium disilicide layer, at the bottom of said contact hole, to a thickness between about 100 to 200 Angstroms.

12. The method of claim 1, wherein said metal is tungsten, deposited using LPCVD processing, at a temperature between about 450° to 475° C., to a thickness between about 6000 to 8000 Angstroms, using a tungsten hexafluoride source.

13. A method for fabricating a MOSFET device, on a semiconductor substrate, using a contact hole lined with titanium for adhesive purposes, lined with titanium nitride for barrier purposes, and filled with tungsten, to provide electrical contact between an active device region and an overlying interconnect metallization, comprising the steps of:

providing device elements on said semiconductor substrate;

deposition of a dielectric layer on said semiconductor substrate, including deposition on said device elements;

photolithographic processing to open a region in photoresist, exposing said dielectric layer, directly over a specific region of said device element;

anisotropic etching of said dielectric layer, in opened region of said photoresist, to create a contact hole to said specific region in said device element;

ion implanting a first conductivity imparting dopant into said specific region of said device element to create a heavily doped N type region;

surface cleaning of said heavily doped N type region;

deposition of a titanium layer on said dielectric layer, on sides of said contact hole, and on said heavily doped N type region;

deposition of a titanium nitride barrier layer on said titanium layer;

annealing in an nitrogen ambient, at a temperature between about 550° to 650° C., for a time between about 45 to 75 min;

deposition of a tungsten on said titanium nitride barrier layer, completely filling said contact hole;

etch back of said tungsten to form a tungsten plug in said contact hole;

deposition of an interconnect metallization layer; and patterning of said interconnect metallization layer to form metal interconnect structure.

14. The method of claim 13, wherein said device element in said semiconductor substrate, is an N type field effect transistor.

15. The method of claim 13, wherein said dielectric layer is silicon oxide, deposited using LPCVD or PECVD processing, at a temperature between about 500° to 750° C., to a thickness between about 8000 to 15000 Angstroms.

16. The method of claim 13, wherein said first conductivity imparting dopant is phosphorous, ion implanted at an energy between about 50 to 80 Kev., at a dose between about 1E15 to 5E15 atoms/cm$^2$.

17. The method of claim 13, wherein said titanium adhesion layer is deposited using r.f. sputtering, to a thickness between about 250 to 350 Angstroms.

18. The method of claim 13, wherein said titanium nitride barrier layer is deposited via direct r.f. sputtering, to a thickness between about 600 to 1000 Angstroms.

19. The method of claim 13, wherein said titanium nitride barrier layer is deposited via reactive r.f. sputtering, using a nitrogen containing ambient, to a thickness between about 600 to 1000 Angstroms.

20. The method of claim 13, wherein annealing of said titanium nitride barrier layer is performed using a nitrogen flow between about 25 to 30 liters/min.; initially to load the wafers at a temperature between about 275° to 325° C., followed by a ramp up and stabilization step at a temperature between about 550° to 650° C., for a time between about 100 to 120 min., an anneal at a temperature between about 550° to 650° C., for a time between about 45 to 75 min., and a ramp down and unload at a temperature between about 275° to 325° C.

21. The method of claim 13, wherein annealing of said titanium nitride barrier layer results in the creation of a titanium disilicide layer, at the bottom of said contact hole, from the reaction of said titanium and said heavily doped N type region, to a thickness between about 100 to 200 Angstroms.

22. The method of claim 13, wherein said tungsten is deposited using LPCVD processing, at a temperature between about 450° to 475° C., to a thickness between about 6000 to 8000 Angstroms, using tungsten hexafluoride as a source.

\* \* \* \* \*